(12) United States Patent
Yu et al.

(10) Patent No.: US 7,705,649 B1
(45) Date of Patent: Apr. 27, 2010

(54) DUTY CYCLE CORRECTION CIRCUIT WITH SMALL DUTY ERROR AND WIDE FREQUENCY RANGE

(75) Inventors: Hao Yu, Fremont, CA (US); Sing W. Chin, Alameda, CA (US); Bill C. Wong, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/062,426

(22) Filed: Apr. 3, 2008

(51) Int. Cl.
*H03K 3/017* (2006.01)
(52) U.S. Cl. ................................... 327/175; 327/158
(58) Field of Classification Search ......... 327/172–176, 327/31, 34, 35, 147–159, 231–238, 243–246, 327/256; 375/373–376; 331/1, 1 R
See application file for complete search history.

(56) References Cited

U.S. PATENT DOCUMENTS

| | | | |
|---|---|---|---|
| 7,129,800 B2 * | 10/2006 | Gauthier et al. ............. 331/175 |
| 7,330,059 B2 | 2/2008 | Tai et al. |
| 7,408,391 B2 * | 8/2008 | Haerle ......................... 327/157 |
| 7,511,584 B2 * | 3/2009 | Hung ........................... 331/57 |

* cited by examiner

*Primary Examiner*—Long Nguyen
*Assistant Examiner*—Sibin Chen
(74) *Attorney, Agent, or Firm*—Patent Law Group LLP; Carmen C. Cook

(57) ABSTRACT

A duty cycle correction circuit (10) for receiving an input clock signal (11) and generating an output clock signal (13) having a predetermined duty cycle includes a clock trigger circuit (12) generating the output clock signal (13) having a first clock edge triggered from the input clock signal and a second clock edge triggered from a delayed clock signal (22); a charge pump circuit (14) receiving the output clock signal and generating charging and discharging currents for a capacitor (C1) where a control voltage develops on the capacitor indicative of the duty cycle error of the output clock signal; a self-track bias circuit (18) receiving the control voltage and generating first and second bias voltages (23, 24) in response to the control voltage; and a delay-locked loop circuit (20) receiving the output clock signal and the first and second bias voltages and generating the delayed clock signal.

11 Claims, 3 Drawing Sheets

DUTY CYCLE CORRECTION CIRCUIT WITH SMALL DUTY ERROR AND WIDE FREQUENCY RANGE

FIELD OF THE INVENTION

The invention relates to duty cycle correction circuit and, in particular, to a duty cycle correction circuit that operates with small duty error and over a wide frequency range.

DESCRIPTION OF THE RELATED ART

A conventional switched-capacitor pipeline analog-to-digital conversion (ADC) system includes multiple consecutive stages, each containing a switched-capacitor sample-and-hold (SAH) circuit, an analog-to-digital converter (ADC) and a multiplying digital to analog converter (MDAC). In switched-capacitor pipeline analog-to-digital conversion (ADC) system, the clock duty cycle plays a very important role to the accuracy of the data conversion. In most systems, a duty cycle of 50% is used. Pipeline ADC systems use both the rising and the falling clock edges for sampling and holding operation.

Assume the clock period is "Ts" and duty cycle is "D", then D*Ts is the time for one stage of the MDAC operational amplifier (opamp) to settle to the residue voltage and (1−D)*Ts is the time for next stage MDAC opamp to settle to the residue voltage. Any error in the duty cycle requires more opamp bandwidth to settle to the same accuracy and therefore, more power consumption is needed.

In an ADC system, the clock signal is generally provided by a crystal oscillator and associated circuitry. The typical clock circuit usually does not provide a clock signal having a duty cycle of 50%. In addition, the clock skew on the printed circuit board also changes the clock duty cycle. These factors require the ADC integrated circuit to provide duty cycle correction (DCC) for the clock signal in order to obtain the desired clock signal having the desired 50% duty cycle.

DETAILED DESCRIPTION OF THE PREFERRED EMBODIMENTS

In accordance with the principles of the present invention, a duty cycle correction circuit incorporates a self-biased delay-locked loop (DLL) and a current-matching charge pump to achieve small duty cycle error over a wide frequency range. The self-biased DLL is biased by biasing voltages that tracks the temperature and process variations of the circuit instead of by fixed voltages. The charge pump generates charging and discharging currents that are well matched and are compensated for output impedance changes when the control voltage varies widely. Consequently, the duty cycle error of the duty cycle correction circuit can be made small over a wide input frequency range. In one embodiment, a watch dog circuit is provided to ensure proper startup and prevent false locking for input clock frequency that changes over a wide range.

The duty cycle correction circuit of the present invention operates without adding significant clock jitter to the output clock. Any jitter on the output clock is undesirable as the jitter degrades the signal-to-noise ratio for high frequency input signal. At the same time, analog-to-digital converters (ADC) may need to work under wide sampling frequency range in different applications. The duty cycle correction circuit of the present invention generates an output clock signal with a 50% duty cycle without introducing undesirable clock jitters. The duty cycle correction circuit of the present invention is capable of achieving a low duty cycle error over a wide frequency range and is therefore advantageous for use in most ADC systems demanding high clock duty cycle accuracy.

Duty Cycle Correction Circuit

Figure 1:
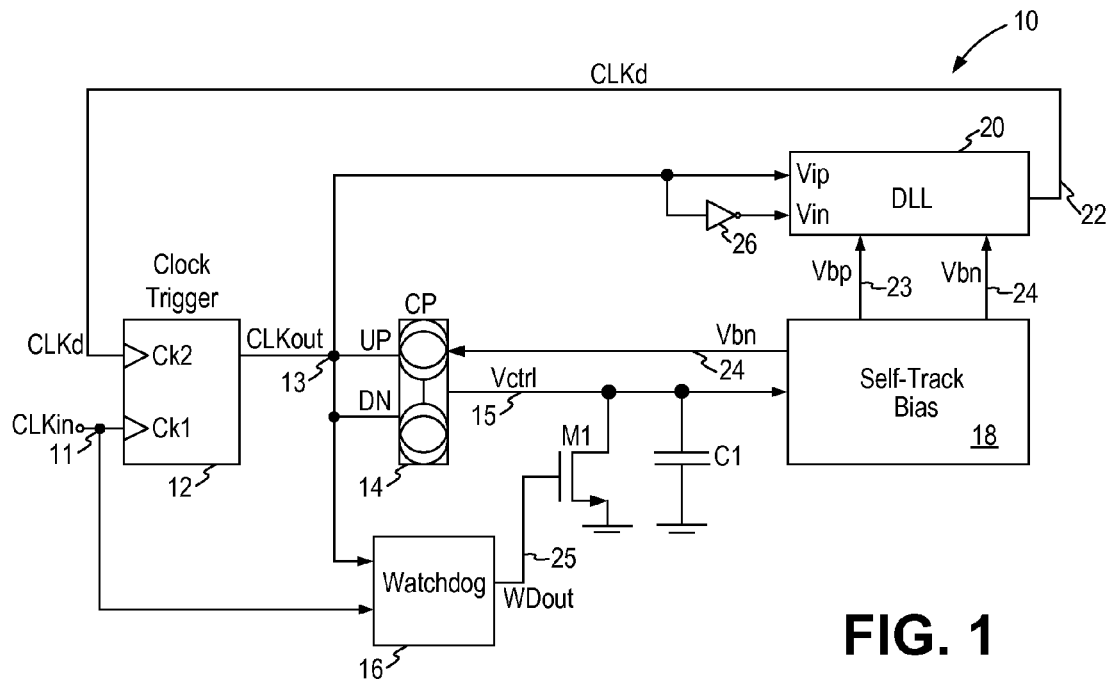
FIG. 1 is a schematic diagram of a duty cycle correction circuit according to one embodiment of the present invention.

FIG. 1 is a schematic diagram of a duty cycle correction circuit according to one embodiment of the present invention. Referring to FIG. 1, a duty cycle correction circuit 10 receives an input clock signal CLKin on a node 11 and generates an output clock signal CLKout on a node 13 having a 50% duty cycle and small duty cycle error. Clock signal CLKout can be used by circuitry outside of circuit 10 that requires a clock signal with an accurate 50% duty cycle. Duty cycle correction circuit 10 includes a clock trigger circuit 12 receiving the input clock CLKin and the delayed clock CLKd as input clock signals Ck1 and Ck2, respectively. The clock trigger circuit 12 generates the output clock signal CLKout having clock edges that are triggered off the rising edges of the input clocks Ck1 and Ck2. More specifically, clock signal CLKout is triggered high by the rising edge of clock CLKin and is triggered low by the rising edge of clock CLKd.

Figure 2:
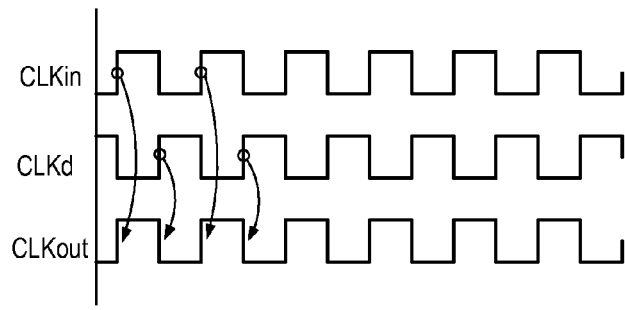
FIG. 2 is a signal waveform diagram illustrating the relationship between the clock signals CLKin, CLKd, and CLKout.

FIG. 2 is a signal waveform diagram illustrating the relationship between the clock signals CLKin, CLKd, and CLKout. Referring to FIG. 2, the output signal CLKout of the clock trigger circuit 12 has rising edges that are triggered by the rising edge of the input clock CLKin and falling edges that are triggered by the rising edge of the delayed clock CLKd. If clock CLKin and clock CLKd are 180° out of phase, then clock CLKout will have a 50% duty cycle.

The output clock CLKout of clock trigger circuit 12 is coupled to a charge pump 14 as well as a delay-locked loop (DLL) 20. Charge pump 14 generates an output current on a node 15 in response to the clock signal CLKout. The output current is either a charging current or a discharging current. The output current from charge pump 14 is coupled to charge or discharge a capacitor C1 acting as a low pass filter. A control voltage Vctrl is generated at node 15 as a result of the charging and discharging of capacitor C1. The control voltage Vctrl is provided to a self-track bias circuit 18 which generates bias voltages Vbp and Vbn on nodes 23 and 24 for DLL 20 and charge pump 14. More specifically, bias voltages Vbp and Vbn are provided to DLL 20 while bias voltage Vbn is provided to charge pump 14. As a result of the bias voltages Vbp and Vbn, the delay through DLL 20 is adjusted so as to introduce a desired amount of delay to the output clock CLKout for generating the delayed clock CLKd.

In steady state operation, clock CLKout should have a duty cycle of 50%. Under this operating condition, the net output current from charge pump 14 is zero and control voltage Vctrl remains at an equilibrium value. That is, when clock CLKout is at the desired 50% duty cycle, charge pump 14 provides charging current half the time and discharging current the other half of the time so that the net current is zero and control voltage Vctrl remains at its steady state value. However, when the duty cycle of clock CLKout is off from 50%, charge pump 14 will generate more charging current or more discharging current, causing control voltage Vctrl to vary from its equilibrium value. The control voltage Vctrl has a value that counteracts the imbalance and when coupled to control DLL 20, acts to bring the duty cycle of clock CLKout back to 50%.

The duty cycle correction circuit of the present invention realizes a particular advantage in reducing clock jitters. More specifically, the duty cycle correction circuit of the present invention generates delayed clock CLKd by taking one clock edge (rising or falling) directly from the input clock CLKin and then manipulates the other clock edge (falling or rising) to obtain the desired 50% duty cycle. As shown in FIGS. 1 and 2, clock trigger circuit 12 generates the output clock signal CLKout having the rising clock edge triggered from the input clock CLKin and the falling clock edge triggered from the delayed clock CLKd. The rising edge of clock CLKout is thus generated directly from the input clock CLKin while the falling edge is modulated by the DLL 20 to obtain the 50% duty cycle. Therefore, any clock jitters that may be introduced by the duty cycle correction circuit will appear only on the one clock edge while the clock edge generated from the input clock remains low in jitters. Because the switch capacitor circuit uses only one clock edge for sampling operation, providing at least one clock edge that is clean has particular advantages when the duty cycle correction circuit is applied in a switch capacitor circuit.

Duty cycle correction circuit 10 uses charge pump 14 that is capable of matching positive and negative current perfectly across process and temperature variations over a wide frequency range. Duty cycle correction circuit 10 also uses self-track bias circuit 18 that operates to enable DLL 20 to work over a wide frequency range with small duty cycle error because the up and down bias currents to the DLL are not fixed. In one embodiment, duty cycle correction circuit is capable of operating over a frequency range of 5-80 MHz while providing a duty cycle error that is less than 0.5%. That is, even as the input clock frequency is varied over a 5-80 MHz range, the duty cycle does not deviate from 50% by more than +/−0.5%.

The detail construction of the DLL circuit, the self-track bias circuit and the charge pump in duty cycle correction circuit 10 will now be described. Duty cycle correction 10 includes a watchdog circuit 16 and an NMOS transistor M1 provided to ensure proper start-up of the circuit, as will be described in more detail below. Watchdog circuit 16 and transistor M1 are optional and may be omitted in other embodiments of the present invention.

Delay-Locked Loop

Figure 3:
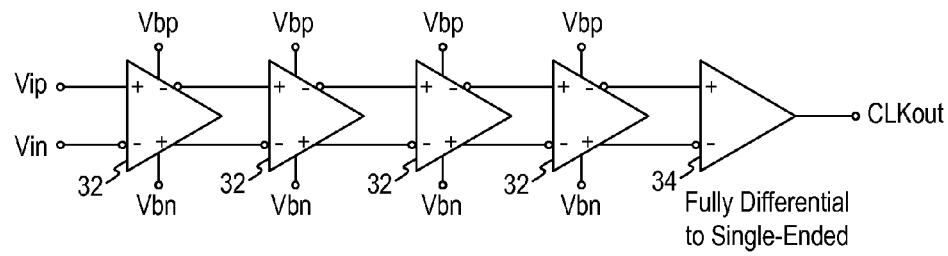
FIG. 3 is a circuit diagram of delay cells forming a delay-locked loop according to one embodiment of the present invention.

In duty cycle correction circuit 10, DLL 20 is the core circuitry for correcting or adjusting the duty cycle of the input clock. FIG. 3 is a circuit diagram of delay cells forming a delay-locked loop according to one embodiment of the present invention. Referring to FIG. 3, DLL 20 includes a set of delay cells 32 connected in series and receiving a pair of differential input voltages Vip and Vin indicative of the clock signal CLKout. The differential input signals are generated from the clock signal CLKout using an inverter 26 (FIG. 1). More specifically, clock signal CLKout is provided directly as the positive input voltage Vip while the inverse of the clock signal CLKout is provided as the negative input voltage Vin. In the present embodiment, each of the delay cells 32 is a differential delay cell receiving differential input signals and generating differential output signals. The final stage in DLL 20 is therefore a differential to single-ended amplifier stage 34 to convert the differential signals to a single-ended output as the delayed clock signal CLKd. Each delay cell 32 receives the bias voltages Vbp and Vbn for adjusting the delay provided by the delay cell. The differential to single-end amplifier stage 34 may be biased by bias voltages Vbp and Vbn or other bias voltages.

In the present embodiment, four stages of delay cells 32 are used to form DLL 20. In other embodiments, N numbers of delay cells 32 can be used where N can be an even or odd number. The number of delay cells that needs to be used to form DLL is a function of the total amount of delay to be provided by the DLL.

Figure 4:
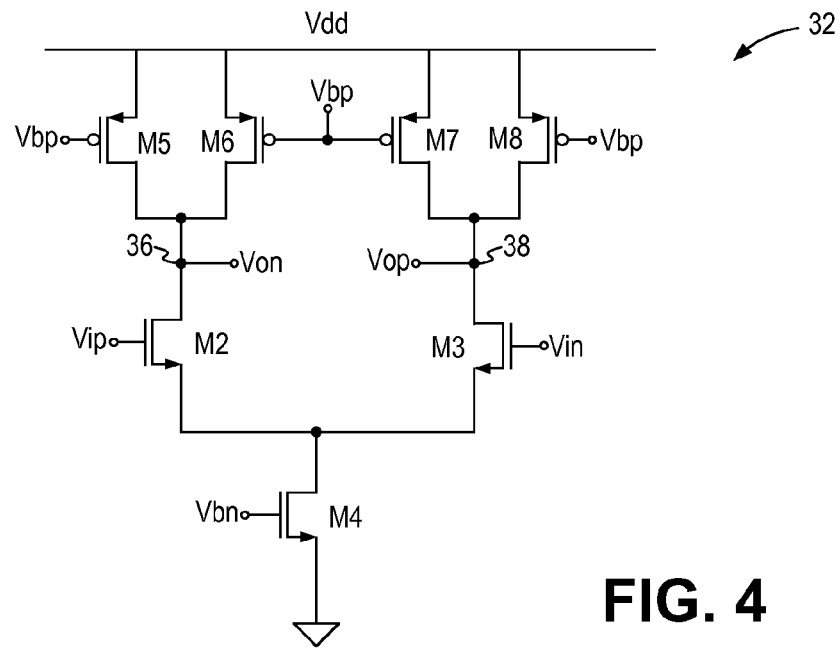
FIG. 4 is a transistor level circuit diagram of a delay cell which can be used to form the delay-locked loop of FIG. 3 according to one embodiment of the present invention.

FIG. 4 is a transistor level circuit diagram of a delay cell which can be used to form the delay-locked loop of FIG. 3 according to one embodiment of the present invention. Referring to FIG. 4, delay cell 32 includes NMOS input transistors M2 and M3 coupled to receive respective differential input voltages Vip and Vin. Input transistors M2 and M3 form a differential pair and provide respective differential output voltages Von and Vop at output nodes 36, 38. Input transistors M2 and M3 are biased by an NMOS transistor M4 which receives bias voltage Vbn as the gate voltage to provide a tail current. Input transistor M2 is further biased by loading PMOS transistor M5 and M6 connected in parallel between the positive power supply voltage Vdd and output node 36 providing output voltage Von. Input transistor M3 is further biased by loading PMOS transistor M7 and M8 connected in parallel between the positive power supply voltage Vdd and output node 38 providing output voltage Vop. PMOS transistors M5 to M8 each receives the bias voltage Vbp as the gate voltage.

In delay cell 32, the bias voltages Vbp and Vbn control the amount of currents provided by transistors M4-M8. As a result, the rate of charging and discharging of output nodes 36 and 38 is altered accordingly to modulate the delay provided by the delay cell. Bias voltages Vbp and Vbn are generated by self-track bias circuit 18 which also provides bias voltage Vbn to charge pump 14. In accordance with the present invention, the bias voltages are generated in self-track bias circuit 18 using transistor structures similar to that in delay cell 32 so that the bias voltages thus generated match the delay cell transistor characteristics. Furthermore, by using the same bias voltages in DLL 20 and in charge pump 14, the bias currents in DLL 20 matches the bias current in charge pump 14 over temperature and process variations to ensure a small duty cycle error. Because of self-tracking bias scheme, the duty cycle correction circuit of the present invention is capable of working over a wide frequency range.

Self-Track Bias Circuit

Figure 5:
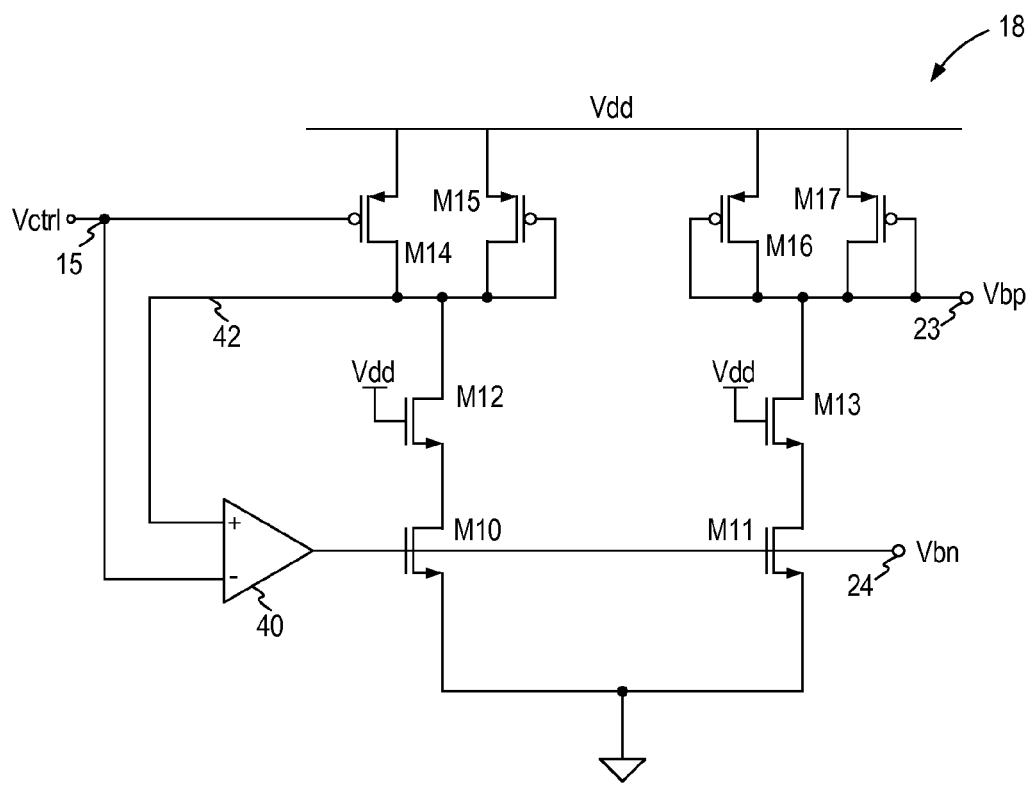
FIG. 5 is a transistor level circuit diagram of a self-track bias circuit which can be incorporated in the duty cycle correction circuit according to one embodiment of the present invention.

The construction and operation of the self-track bias circuit 18 will now be described with reference to the transistor level circuit diagram of FIG. 5. Referring to FIG. 5, self-track bias circuit 18 has a transistor level construction that mimics the transistor level construction of the delay cell in the delay-locked loop. More specifically, delay cell 32 of FIG. 4 includes two current branches, each formed by two parallelly connected PMOS transistors connected in series with two other NMOS transistors. For example, a first current branch in delay cell 32 includes PMOS transistors M5 and M6 connected in parallel and then connected in series with NMOS transistors M2 and M4. Similarly, a second current branch in delay cell 32 includes PMOS transistors M7 and M8 connected in parallel and then connected in series with NMOS transistors M3 and M4. Self-track bias circuit 18 in turn is also constructed using two current branches, one current branch providing the bias voltage Vbn and the other current branch providing the bias voltage Vbp.

Each current branch in self-track bias circuit 18 is constructed in the same manner as the current branch in delay cell 32. Thus, in self-track bias circuit 18, a first current branch is formed by a pair of PMOS transistors M14 and M15 connected in parallel between the power supply voltage Vdd and a node 42. The PMOS transistor pair M14/M15 are in turn connected in series with NMOS transistor M12 and M10. PMOS transistor pair M14/M15 mimic PMOS transistors M5/M6 or M7/M8 in delay cell 32 of FIG. 4. NMOS transistor M12 mimics input transistor M2/M3 of delay cell 32 while NMOS transistor M10 mimics the tail current transistor M4 of delay cell 32. Transistor M12 receives the power supply voltage Vdd as the gate voltage and is always turned on. The first current branch in self-track bias circuit 18 generates the bias voltage Vbn on a node 24.

A second current branch in self-track bias circuit 18 is formed in the same manner as the first current branch. The second current branch is formed by a pair of PMOS transistors M16 and M17 connected in parallel between the power supply voltage Vdd and a node 23. The PMOS transistor pair M16/M17 are in turn connected in series with NMOS transistor M13 and M11. PMOS transistor pair M16/M17 mimic PMOS transistors M5/M6 or M7/M8 in delay cell 32 of FIG. 4. NMOS transistor M13 mimics input transistor M2/M3 of delay cell 32 while NMOS transistor M11 mimics the tail current transistor M4 of delay cell 32. Transistor M13 receives the power supply voltage Vdd as the gate voltage and is always turned on. The second current branch in self-track bias circuit 18 generates the bias voltage Vbp on a node 23.

Self-track bias circuit 18 further includes an operational amplifier (opamp) 40 receiving the control voltage Vctrl on node 15 and also the voltage on node 42 in the first current branch. Control voltage Vctrl is also coupled to the gate of PMOS transistor M14. The output voltage from opamp 40 is coupled to drive the gate terminals of NMOS transistors M10 and M11 and is also the bias voltage Vbn. The gate terminals of PMOS transistors M16 and M17 are connected together and to node 23, providing the bias voltage Vbp.

In operation, opamp 40 operates to drive the voltage at node 42 to equal to control voltage Vctrl. Transistors M14 and M15 are thus both driven by a voltage equaling voltage Vctrl as the gate voltage. The output voltage of opamp 40 is the bias voltage Vbn and is coupled to drive the gate terminals of NMOS transistors M10 and M11. As a result, a current flows in the first current branch having a current value determined by the control voltage Vctrl. Because NMOS transistor M11 in the second current branch is driven by the same gate voltage Vbn as transistor M10 in the first current branch and because the second current branch has the same transistor structure as the first current branch, the gate voltage at the PMOS transistors M16 and M17 (node 23) in the second current branch is forced to equal to the same voltage driving the gate terminals of transistors M14 and M15. Therefore, voltage Vbp at node 23 is driven to the control voltage Vctrl.

As thus constructed, self-track bias circuit 18 receives the control voltage Vctrl and generates bias voltages Vbp and Vbn based on the control voltage Vctrl. Bias voltages Vbp and Vbn are generated using the same transistor structure as the delay cell so that bias voltages Vbp and Vbn experience the same temperature or process variations that the delay cells experience. Any performance deviations in the delay cell due to temperature or process variation will be counteracted by corresponding variations in the bias voltages Vbp and Vbn. Accordingly, each delay cell 32 in DLL 20 provides accurate delay over temperature and process variations for adjusting the duty cycle of the output clock, resulting in a small duty cycle error.

Charge Pump

As described above, duty cycle correction circuit 10 includes a current matching charge pump 14 for generating a charging and discharging current in accordance with clock signal CLKout. The charging and discharging current is used to charge a capacitor C1 to generate the control voltage Vctrl. Charge pump 14 receives bias voltage Vbn from self-track bias circuit 18 so that charge pump 14 generates control voltage Vctrl being matched to the current flowing in the delay cell.

Figure 6:
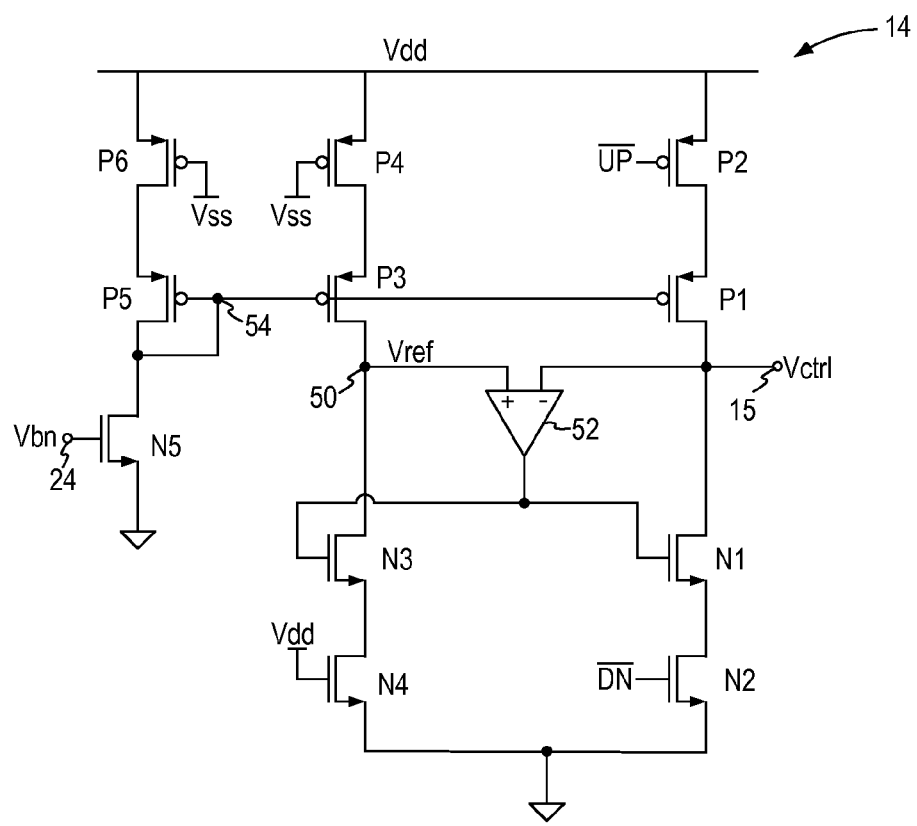
FIG. 6 is a transistor level circuit diagram of a charge pump which can be incorporated in the duty cycle correction circuit according to one embodiment of the present invention.

FIG. 6 is a transistor level circuit diagram of a charge pump which can be incorporated in the duty cycle correction circuit according to one embodiment of the present invention. Referring to FIG. 6, charge pump 14 receives the clock signal CLKout as both the UP and DN (down) input signals and generates control voltage Vctrl on node 15. In charge pump circuit 14, the inverse of the UP input signal is coupled to drive a PMOS transistor P2 and the inverse of the DN input signal is coupled to drive an NMOS transistor N2. The inverses of the UP signal and the DN signal are essentially the same signal because the UP and DN signals are connected to the same clock signal CLKout. When clock CLKout is high, transistor P2 is turned on, and when clock CLKout is low, transistor N2 is turned on. When transistor P2 is turned on, a charging current flows from transistor P2 to a PMOS transistor P1 to charge up control voltage Vctrl. When transistor N2 is turned on, a discharging current flows from an NMOS transistor N1 to transistor N2 to discharge control voltage Vctrl. To achieve a 50% duty cycle, the charging current flowing through PMOS transistors P1 and P2 needs to be the same as the discharging current flowing through NMOS transistors N1 and N2. In this manner, based on the clock CLKout, charge pump 14 charges voltage Vctrl half of the time and discharges voltage Vctrl half of the time to maintain a 50% duty cycle.

As long as transistors P1 and N1 are biased so that the charging current equals the discharging current, charge pump 14 will be capable of maintaining the desired 50% duty cycle. However, due to temperature and process variations, transistor performance may vary, resulting in errors or imbalance in the charging and discharging currents at output node 15. To ensure current matching, charge pump 14 includes an operation amplifier 52 and biasing transistors N3-N5 and P3-P6 to force the charging current provided by transistors P1/P2 to match the discharging current provided by transistors N1/N2.

When control voltage Vctrl changes over a wide range, the drain-to-source voltage Vds of transistors P1 and N1 will change over a wide range as well. The variations of the Vds voltages in transistors P1 and N1 result in current mismatch between the charging current and the discharging current and the current mismatch may be larger than 5% due to the finite output impedance of transistors P1 and N1. Operational amplifier 52 is used to adjust the gate voltage of transistor N1 so that variations in voltage Vctrl will not affect current matching in the charge pump circuit.

More specifically, transistors P3-P4 and N3-N4 are included in charge pump 14 to form an equivalent current branch to transistors P1-P2 and N1-N2. The equivalent current branch works with opamp 52 to generate the gate drive voltage for NMOS transistors N3 and N1. In the equivalent current branch, PMOS transistor P4 mimics transistor P2 and has its gate terminal grounded so that the transistor remains turned on. NMOS transistor N4 mimics transistor N2 and has its gate terminal connected to power supply voltage Vdd so that the transistor remains turned on. NMOS transistor N3 mimics transistor N1 and both have their gate terminals driven by the output of opamp 52. PMOS transistor P3 mimics transistor P1 and both have their gate terminals driven by voltage developed by a current mirror formed by transistors P5 and P6.

In charge pump 14, the bias voltage Vbn is coupled to drive the gate terminal of NMOS transistor N5. A current flowing through transistor N5 is thus a function of the bias voltage Vbn. PMOS transistor P6 has its gate terminal connected to ground and thus remains turned on. PMOS transistor P5 is diode connected so that it mirrors the current flowing in NMOS transistor N5 to transistor P3 and P1. Thus, the same charge current flows through transistors P1 and P3. The charging current through transistor P1 is determined by the bias voltage Vbn through the current mirror of transistors P1, P3 and P5. The same charging current flows through transistor P3. At transistor P3, a reference voltage at a node 50 is forced to be the same as the control voltage Vctrl due to opamp 52. The output voltage of opamp 52 drives transistors N1 and N3 so that the same discharging current flows through transistors N1 and N3. As long as transistors N1 and N3 are driven by the same gate voltage, the discharging current is the same as at the two transistors and the charging current through transistors P1 and P3 will also be forced to be the same. In this manner, charge pump 14 tracks process and temperature variations and generates matching charging and discharging currents over process and temperature variations.

Watchdog Circuit

One common problem with delay-lock loop circuits is false locking where the delay of DLL is equal to multiple clock periods so that even when the two clocks are off by the same multiple clock periods, the loop is still considered locked. Furthermore, some DLL circuits may become stuck and not toggle upon circuit start up if the control voltage becomes stuck at a high voltage.

Returning to FIG. 1, duty cycle correction circuit 10 includes a watchdog circuit 16 and NMOS transistor M1 to bias the circuit to ensure proper circuit start up. Watchdog circuit 16 monitors the clock signal CLKout. If clock CLKout does not toggle within a given number of cycle, then the output WDout (node 25) of watchdog circuit 16 is pull high to cause transistor M1 to turn on. When transistor M1 is turned on, the control voltage Vctrl (node 15) is pulled down which will ensure the delay-locked loop will toggle.

Figure 7:
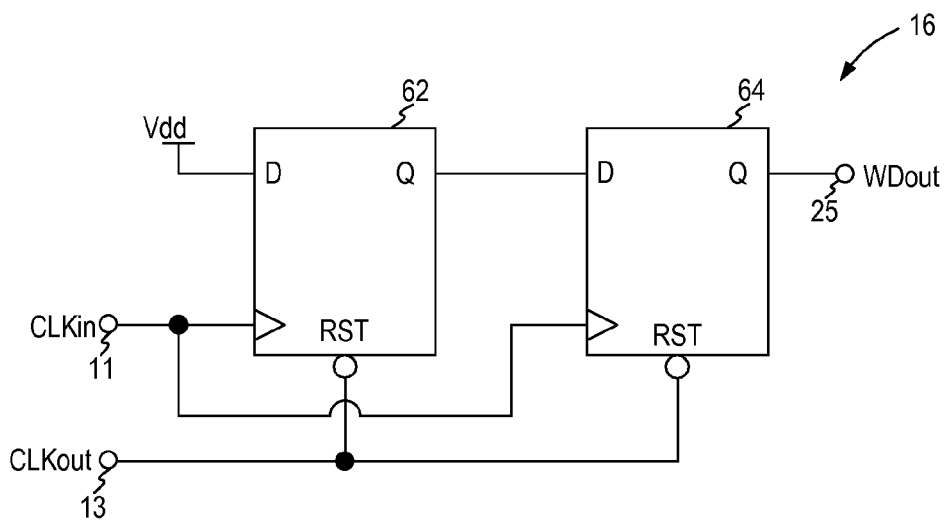
FIG. 7 is a schematic diagram of a watchdog circuit which can be incorporated in the duty cycle correction circuit according to one embodiment of the present invention.

FIG. 7 is a schematic diagram of a watchdog circuit which can be incorporated in the duty cycle correction circuit according to one embodiment of the present invention. Referring to FIG. 7, watchdog circuit 16 includes two D-flip-flop (D-FF) 62, 64 connected in series. Input clock CLKin (node 11) is coupled to the clock terminals of D-FF 62 and 64 and clock signal CLKout (node 13) is coupled to the reset terminals of both D-FFs. The data terminal of the first D-FF 62 is coupled to the power supply voltage Vdd and the data terminal of the second D-FF 64 is connected to the output terminal of the first D-FF 62. The output terminal of the second D-FF 64 provides the watchdog output signal WDout (node 25) for driving NMOS transistor M1.

Thus, if clock signal CLKout is stuck high and not toggling, the reset terminals of the two D-FFs are not asserted. Then, after two cycles of clock CLKin, the Vdd voltage level at the D input of D-FF 62 is passed to the output terminal of D-FF 64. The output signal WDout is pull high to turn on transistor M1 to reset the control voltage Vctrl. On the other hand, if clock signal CLKout is functioning properly, the rising edge of each clock cycle of CLKin causes the data output of D-FF 62 to go high but the falling edge of each clock cycle of CLKout causes the data output of D-FF 62 to reset, clock CLKin and clock CLKout being in phase. Thus, only a low signal is passed to D-FF 64 and the watchdog output signal WDout does not toggle high.

In the embodiment shown in FIG. 7, two D-FFs are used and therefore watchdog circuit 16 acts to reset the control voltage node after two clock cycles of inactivity of clock signal CLKout. In other embodiments, M number of D-FFs can be used so that watchdog circuit 16 resets the control voltage node after M clock cycles of inactivity of clock signal CLKout.

The above detailed descriptions are provided to illustrate specific embodiments of the present invention and are not intended to be limiting. Numerous modifications and variations within the scope of the present invention are possible. The present invention is defined by the appended claims.

We claim:

1. A duty cycle correction circuit (10) for receiving an input clock signal (11) and generating an output clock signal (13) having a predetermined duty cycle, comprising:
   a clock trigger circuit (12) receiving the input clock signal and a delayed clock signal (22), the clock trigger circuit generating the output clock signal (13) having a first clock edge triggered from a first clock edge of the input clock signal and a second clock edge triggered from a first clock edge of the delayed clock signal;
   a charge pump circuit (14) receiving the output clock signal as input signal and generating a charging current and a discharging current at an output node (15) for charging and discharging a capacitor (C1), a control voltage develops on the capacitor indicative of the duty cycle error of the output clock signal;
   a self-track bias circuit (18) receiving the control voltage and generating first and second bias voltages (23, 24) in response to the control voltage; and
   a delay-locked loop circuit (20) receiving the output clock signal and the first and second bias voltages, the delay-locked loop circuit generating the delayed clock signal having a first delay from the output clock signal, the first delay being corresponding to the first and second bias voltages, the delay-locked loop circuit comprising a plurality of delay cells connected in series, each of the delay cells (32) being biased by the first and second bias voltages to generate a second delay,
   wherein the self-track bias circuit generates the first and second bias voltages using circuitry matching that of the delay cell of the delay-locked loop, the first and second bias voltages providing compensation for temperature and process variations of the delay cell.

2. The duty cycle correction circuit of claim 1, wherein the first clock edge comprises a rising clock edge and the second clock edge comprises a falling clock edge.

3. The duty cycle correction circuit of claim 1, wherein the predetermined duty cycle is 50%.

4. The duty cycle correction circuit of claim 1, wherein the plurality of delay cells in the delay-locked loop circuit comprises a plurality of differential delay cells, the delay-locked loop circuit further comprising a differential to single-ended amplifier circuit (34) coupled to the last delay cell for generating the delayed clock signal.

5. The duty cycle correction circuit of claim 4, wherein each differential delay cell comprises:

a differential pair formed by first and second input transistors (M2, M3), the first and second input transistors receiving a pair of differential input signals and generating a pair of differential output signals at a pair of differential output terminals (36, 38);

a tail current transistor (M4) coupled to the differential pair to provide a tail current; and first and second pairs of loading transistors (M5-M8), each pair of loading transistor being connected in parallel between a positive power supply voltage and a respective differential output parallel and having gate terminals biased by the first bias voltage (23), wherein one pair of first and second pairs of loading transistors, one of the input transistors, and the tail current transistor form a current branch in the differential delay cell.

6. The duty cycle correction circuit of claim 5, wherein the self-track bias circuit comprises:

a first current branch formed to match a current branch of the differential delay cell, the first current branch comprising a third pair of loading transistors (M14, M15), a first transistor (M12) being turned on, and a second transistor (M10), all connected in series between the positive power supply voltage and the ground voltage, the gate terminal of a first transistor in the third pair of load transistors (M14) being coupled to receive the control voltage;

a second current branch formed to match a current branch of the differential delay cell, the second current branch comprising a fourth pair of loading transistors (M16, M17), a third transistor (M13) being turned on, and a fourth transistor (M11), all connected in series between the positive power supply voltage and the ground voltage, the gate terminals and the drain terminals of the third pair of load transistors being connected together and to each other and providing the first bias voltage (23); and an operational amplifier having a first input terminal coupled to receive the control voltage, a second input terminal coupled to the gate terminal of a second transistor in the third pair of load transistors (M15), and an output terminal driving the gate terminals of the second and fourth transistors, the operational amplifier operative to force the voltage at the gate terminal of the second transistor in the third pair of load transistors to the control voltage, the voltage at the output terminal of the operational amplifier being the second bias voltage (24).

7. The duty cycle correction circuit of claim 6, wherein the load transistors comprise PMOS transistors and all other transistors comprise NMOS transistors.

8. The duty cycle correction circuit of claim 1, wherein the charge pump circuit generates alternate charging and discharging currents in response to the output clock signal, the charging current matching in magnitude to the discharging current.

9. The duty cycle correction circuit of claim 8, wherein the charge pump circuit comprises:

a first PMOS transistor (P1) and a second PMOS transistor (P2) connected in series between a positive power supply voltage and the output node (15), the second PMOS transistor having a gate terminal coupled to receive an inverse of the output clock signal, the first and second PMOS transistors providing the charging current to the output node;

a first NMOS transistor (N1) and a second NMOS transistor (N2) connected in series between the output node (15) and the ground voltage, the second NMOS transistor having a gate terminal coupled to receive an inverse of the output clock signal, the first and second NMOS transistors providing the discharging current to the output node;

a third PMOS transistor (P3) and a fourth PMOS transistor (P4) connected in series between the positive power supply voltage and a reference node (50), the fourth PMOS transistor being turned on;

a third NMOS transistor (N3) and a fourth NMOS transistor (N4) connected in series between the reference node (50) and the ground voltage, the fourth NMOS transistor being turned on;

a fifth NMOS transistor (N5) receiving the second bias voltage (24) as a gate voltage and generating a drain current indicative of the second bias voltage;

fifth and sixth PMOS transistors (P5, P6) coupled to the fifth NMOS transistor to receive the drain current, the fifth and sixth PMOS transistors form first and second current mirrors with respective first and second PMOS transistors and third and fourth PMOS transistors, the drain current of the fifth NMOS transistor being mirrored in the third and the first NMOS transistors; and an operational amplifier (52) having a first input terminal coupled to the output node (15), a second input terminal coupled to the reference node (50), and an output terminal coupled to drive the gate terminals of the first and the third NMOS transistors.

10. The duty cycle correction circuit of claim 1, further comprising:

a watchdog circuit (16) receiving the input clock signal and the output clock signal and generating a first output signal (25); and a first transistor (M1) coupled between the output node of the charge pump circuit and the ground node, the gate terminal of the first transistor being driven by the first output signal, wherein when the output clock signal fails to toggle for M number of clock cycles, the watchdog circuit asserts the first output signal to turn on the first transistor for resetting the output node of the charge pump circuit.

11. The duty cycle correction circuit of claim 10, wherein the first transistor comprises an NMOS transistor and the watchdog circuit comprises first and second D-flip-flops, the clock terminals of the first and second D-flip-flops receiving the input clock signal, the reset terminals receiving the output clock signal, the data input terminal of the first D-flip-flop being coupled to the positive power supply voltage and the data input terminal of the second D-flip-flop being coupled to the data output terminal of the first D-flip-flop, the data output terminal of the second D-flip-flop providing the first output signal.

* * * * *